US010600701B2

(12) United States Patent
Mackh et al.

(10) Patent No.: US 10,600,701 B2
(45) Date of Patent: Mar. 24, 2020

(54) WAFER AND METHOD FOR PROCESSING A WAFER

(71) Applicant: Infineon Technologies AG, Neubiberg (DE)

(72) Inventors: Gunther Mackh, Neumarkt (DE); Gerhard Leschik, Regensburg (DE); Maria Heidenblut, Schwarzenfeld (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/120,485

(22) Filed: Sep. 4, 2018

(65) Prior Publication Data

US 2018/0374766 A1 Dec. 27, 2018

Related U.S. Application Data

(62) Division of application No. 13/651,496, filed on Oct. 15, 2012, now Pat. No. 10,090,214.

(51) Int. Cl.
*H01L 21/66* (2006.01)
*H01L 21/683* (2006.01)

(52) U.S. Cl.
CPC ......... *H01L 22/34* (2013.01); *H01L 21/6836* (2013.01); *H01L 2221/68336* (2013.01)

(58) Field of Classification Search
CPC ............ H01L 22/34; H01L 21/6836; H01L 2221/68336; H01L 21/67092
See application file for complete search history.

(56) References Cited

U.S. PATENT DOCUMENTS

| | | | | |
|---|---|---|---|---|
| 5,321,211 | A * | 6/1994 | Haslam | H01L 21/76802 174/255 |
| 2006/0084240 | A1* | 4/2006 | Poo | H01L 21/78 438/460 |
| 2008/0265378 | A1* | 10/2008 | Lee | H01L 23/544 257/620 |
| 2009/0121337 | A1* | 5/2009 | Abe | H01L 21/67092 257/686 |
| 2011/0244657 | A1* | 10/2011 | Grivna | H01L 21/78 438/462 |
| 2012/0091455 | A1* | 4/2012 | Chen | H01L 22/32 257/48 |

\* cited by examiner

*Primary Examiner* — Dale E Page
*Assistant Examiner* — Wilner Jean Baptiste
(74) *Attorney, Agent, or Firm* — Viering, Jentschura & Partner MBB

(57) ABSTRACT

A wafer in accordance with various embodiments may include: at least one metallization structure including at least one opening; and at least one separation line region along which the wafer is to be diced, wherein the at least one separation line region intersects the at least one opening.

20 Claims, 12 Drawing Sheets

WAFER AND METHOD FOR PROCESSING A WAFER

CROSS-REFERENCE TO RELATED APPLICATIONS

This application is a divisional of U.S. patent application Ser. No. 13/651,496, filed Oct. 15, 2012 and entitled "WAFER AND METHOD FOR PROCESSING A WAFER", which is incorporated herein by reference in its entirety.

TECHNICAL FIELD

Various embodiments relate generally to a wafer, and to a method for processing a wafer.

BACKGROUND

Modern semiconductor devices such as, for example, integrated circuit (IC) devices or chips may typically be manufactured using wafers. A wafer may typically include one or a plurality of integrally formed dies, and one or more separation line regions (for example, kerf regions or scribe line regions), along which the wafer may be diced to individualize the dies or chips. Sometimes, one or more of the separation line regions may be at least partially filled with one or more electrical structures such as PCM (process control monitoring) structures or other testlines or metrology structures, and metallization areas or pads (e.g. testline pads) may be provided in the separation line regions to enable electrical contact to those electrical structures (e.g testlines).

Dicing the wafer may commonly be carried out mechanically by means of cutting, though other dicing methods have recently emerged, such as laser stealth dicing (sometimes simply referred to as stealth dicing or laser dicing). Laser stealth dicing may include a two-stage process in which defect regions may be firstly introduced into the wafer by scanning a laser beam (typically, an infrared (IR) laser beam) along the separation line region or regions and secondly an underlying elastic carrier, e.g. a carrier membrane or tape, may be expanded to induce fracture of the wafer at the separation line region or regions.

Laser stealth dicing may be seen as a separation or dicing method which may achieve high quality sidewalls in the wafer material (e.g. silicon). Up to now, one restriction of laser stealth dicing, though, may be seen in that laser stealth dicing may not be able to separate stacks of thick metal layers. For example, it may be difficult to well separate a thick last metal of PCM or testline pads in separation line regions of the wafer.

Laser stealth dicing may generally be very cost-efficient for small chips (e.g. chips having an area in the range from about 3 mm² to about 5 mm²) and thin wafer thicknesses. For small chips, testlines may typically be placed in drop-in areas of the wafer replacing chips. Thus, a cost-efficient small separation line region (for example having a width in the range of about 15-20 µm), and/or a separation line region free of metal plates may be obtained, which may provide good conditions for stealth dicing.

On the other hand, for large chips (e.g. chips having an area larger than 5 mm²), it may generally be more efficient to use wafers, in which testlines and corresponding pads are placed in the separation line region or regions. For these chips, stealth dicing may generally be highly efficient for thin wafer thicknesses, for example wafer thicknesses lower than 150 µm, where stealth dicing may, for example, require only one or two laser scans with a scanning speed of more than 300 mm/s, whereas mechanical dicing may typically be done with a step cut at a speed of around 50 mm/s or even slower. In the latter case, it may be desirable that the stealth dicing may be able to separate the pads (e.g. testline pads) in the separation line region or regions, for example pads including thick metal layers.

SUMMARY

A wafer in accordance with various embodiments may include: at least one metallization structure including at least one opening; and at least one separation line region along which the wafer is to be diced, wherein the at least one separation line region intersects the at least one opening.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various aspects of the disclosure are provided for methods, and various aspects of the disclosure are provided for devices or manufactures. It will be understood that basic properties of the methods may also hold for the devices or manufactures and vice versa. Therefore, for sake of brevity, duplicate description of such properties may be omitted.

The terms "at least one" or "one or more" as used herein may be understood to include any integer number greater than or equal to one.

The term "a plurality of" as used herein may be understood to include any integer number greater than or equal to two.

The terms "coupling" or "connection" as used herein may be understood to include a direct "coupling" or direct "connection" as well as an indirect "coupling" or indirect "connection", respectively.

The terms "formed over", "deposited over", "disposed over", "located over", "arranged over" as used herein are intended to include arrangements where a first element or layer may be formed, deposited, disposed, located or arranged directly on a second element or layer with no further elements or layers in-between, as well as arrangements where a first element or layer may be formed, deposited, disposed, located or arranged above a second element or layer with one or more additional elements or layers between the first element or layer and the second element or layer.

The term "wafer" as used herein may be understood to include a semiconductor wafer or semiconductor wafer substrate. The semiconductor wafer or semiconductor wafer substrate may include silicon (Si), or other semiconductor wafer materials (including compound semiconductor materials), such as silicon carbide (SiC), gallium arsenide (GaAs), gallium nitride (GaN), or indium phosphide (InP), although other materials may be possible as well. A "wafer" may also include other materials than semiconductors, for example insulating or dielectric materials, and/or conducting materials.

Figure 1:
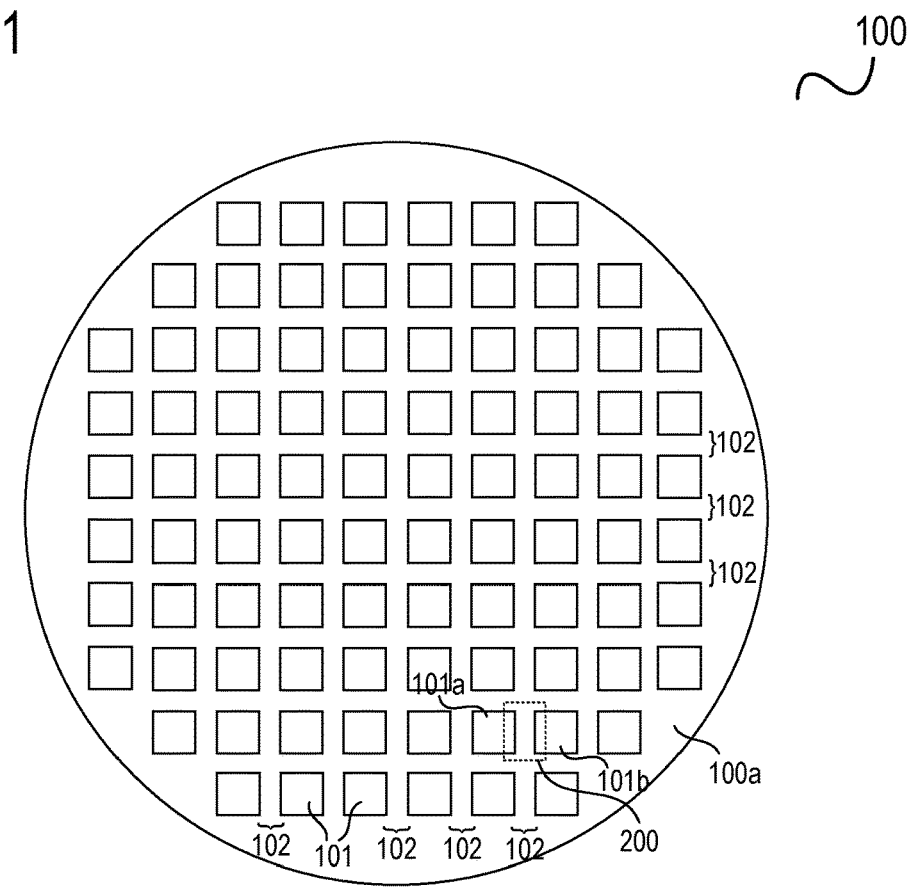
FIG. 1 shows a plan view of a wafer for illustrating an aspect of one or more embodiments.
Figure 2A:
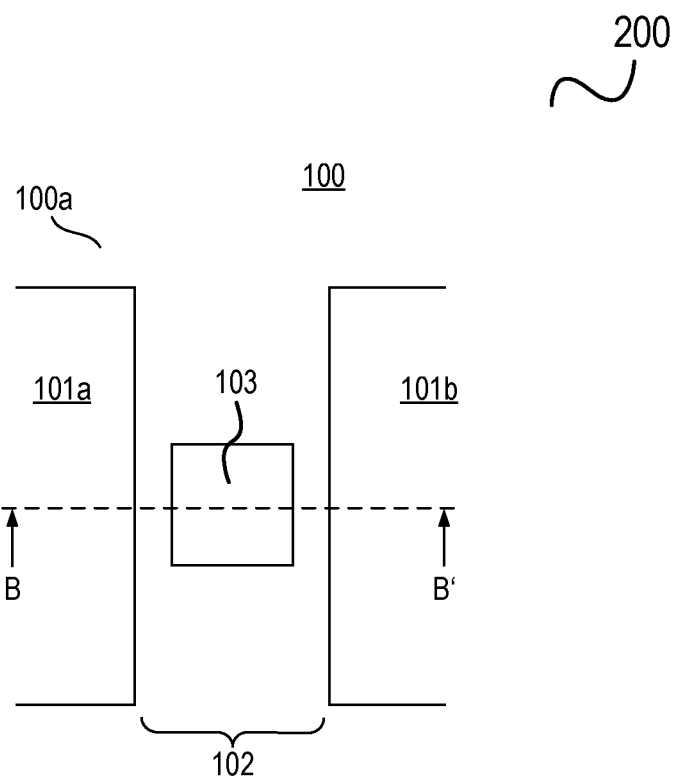
FIG. 2A shows a plan view of a section of the wafer shown in FIG. 1.
Figure 2B:
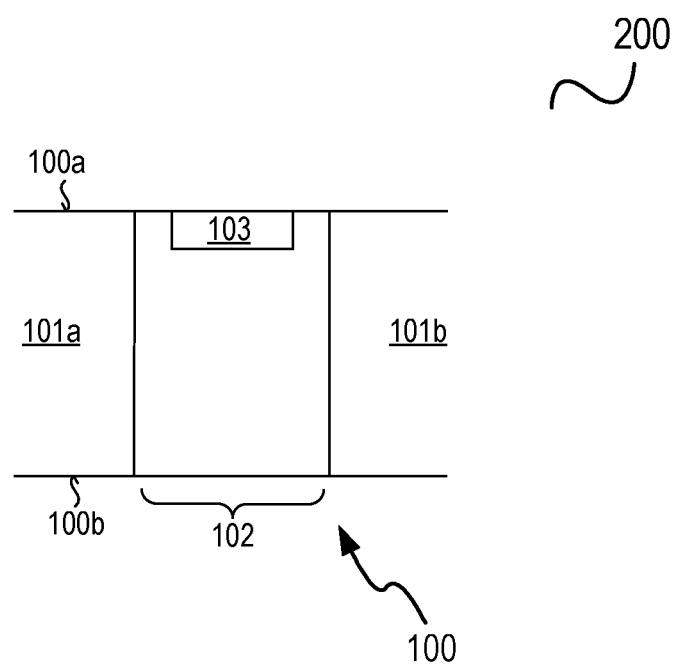
FIG. 2B shows a cross-sectional view along line B-B' in FIG. 2A.

FIG. 1 shows a plan view of a wafer 100, FIG. 2A shows a plan view of a section 200 of wafer 100 shown in FIG. 1, and FIG. 2B shows a cross-sectional view of section 200 of wafer 100 taken along line B-B' in FIG. 2A, for illustrating an aspect of one or more embodiments.

Wafer 100 may include one or more, e.g. a plurality of, die regions 101 (which may correspond to one or more dies or chips) separated by one or more, e.g. a plurality of, separation line regions 102 (e.g. kerf regions or scribe line regions). The number of die regions 101 may be arbitrary. As shown in FIG. 1, die regions 101 may have a quadratic shape, however one or more die regions 101 may also have a rectangular shape, or any other shape in general. As shown in FIG. 1, die regions 101 may be arranged in a rectangular array, however die regions 101 may also be arranged differently. As shown in FIG. 1, wafer 100 may have a circular shape, however wafer 100 may also have a rectangular shape, or a quadratic shape, or any other shape in general.

Wafer 100 may include a front side 100a, and a back side 100b (see FIG. 2B) opposite the front side 100a.

One or more pads 103 such as, for example, PCM or testline pads may be placed in the one or more separation line regions 102 of wafer 100, as shown in FIG. 2A, which shows an enlarged view of section 200 of wafer 100. Pad(s) 103 may include or may consist of a metal or metal alloy. A pad including or consisting of a metal or metal alloy may also be referred to as a metal pad.

As shown in FIG. 2A and FIG. 2B, pad 103 (e.g. PCM or testline pad) may be placed in separation line region 102 of wafer 100, for example between a first die region 101a and a second die region 101b of die regions 101. Pad 103 may serve to electrically connect one or more electrical devices, e.g. test devices (not shown), which may be placed in the separation line region 102, for example in one or more layers or levels below pad 103. To this end, pad 103 may be connected to the one or more electrical devices, e.g. by one or more electrical interconnects and/or vias (not shown), which may be located in one or more layers or levels below pad 103. Pad 103 may be disposed at the front side 100a of wafer 100, as shown.

Wafer 100 may be diced along separation line region 102 shown in FIG. 2A, and along further separation line regions 102 shown in FIG. 1, to individualize the dies or chips corresponding to the one or more die regions 101 (e.g. die regions 101a and 101b).

Dicing wafer 100 may, for example, be carried out using a laser stealth dicing process, as illustrated below in FIG. 3, FIG. 4A and FIG. 4B.

Figure 3:
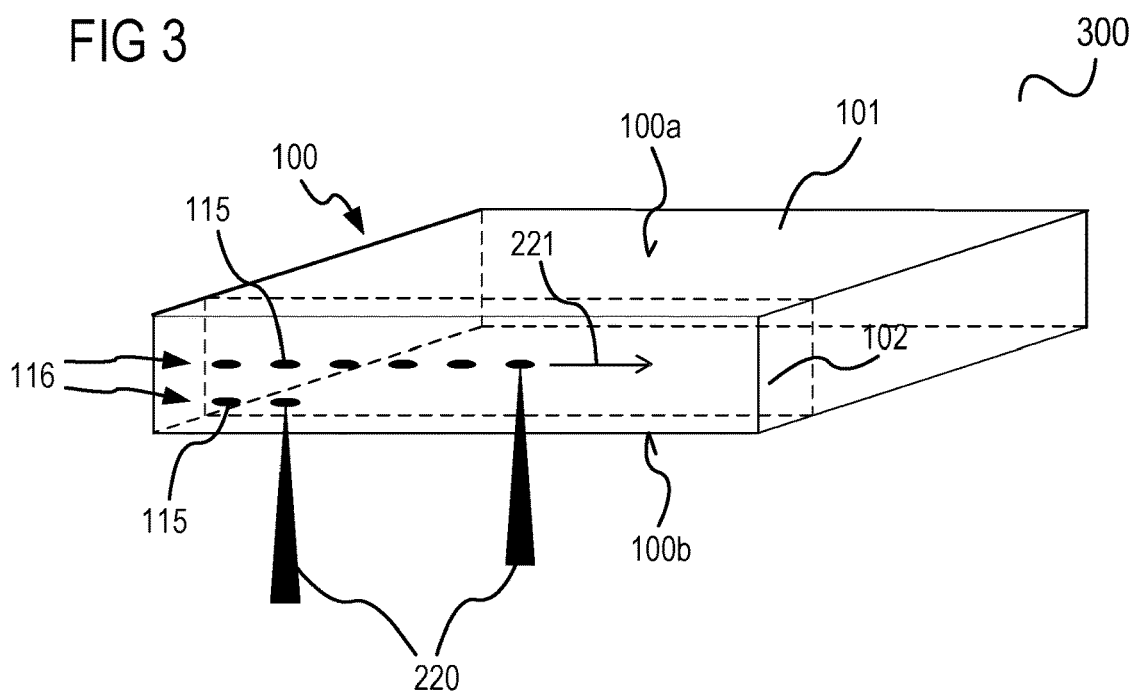
FIG. 3, FIG. 4A and FIG. 4B show views for illustrating a stealth dicing process applied to the wafer of FIG. 1, for illustrating an aspect of one or more embodiments.
Figure 4A:
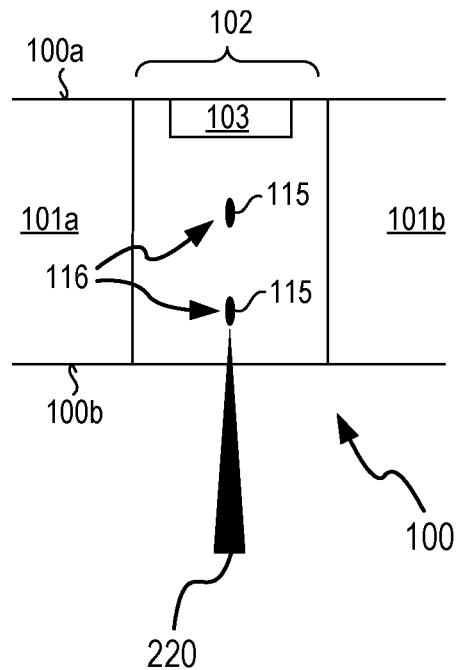
Figure 4B:
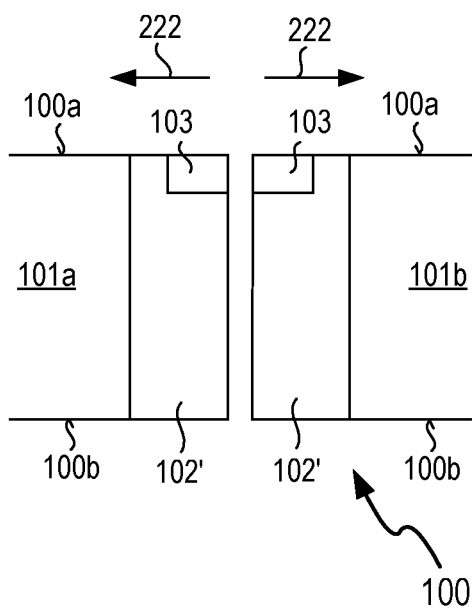

FIG. 3, FIG. 4A and FIG. 4B show views 300, 320, and 340, respectively, illustrating a laser stealth dicing process applied to wafer 100, for illustrating an aspect of one or more embodiments.

Laser stealth dicing (sometimes simply referred to as stealth dicing or laser dicing) may be understood to refer to a dicing method that may form a modified layer in a workpiece such as wafer 100 by focusing a laser 220 inside the workpiece (as shown in view 300 of FIG. 3 and view 320 of FIG. 4A). Subsequently, the dies or chips of wafer 100 may be separated, for example by using a tape expander (as shown in view 340 of FIG. 4B).

More particularly, a laser beam 220 at a wavelength capable of transmitting through wafer 100 (typically, a laser having an infrared (IR) wavelength, for example a wavelength of about 1064 nm, 1080 nm, or 1342 nm, although other wavelengths may be possible as well) may be condensed by an objective lens (not shown) and focused onto a point inside wafer 100, for example a point inside a separation line region 102 of wafer 100, as shown in view 300 of FIG. 3 and view 320 of FIG. 4A. Laser beam 220 may, for example, consist of short pulses oscillating at a high repetition rate and may be highly condensed. This localized beam 220 may, for example, be formed at an extremely high peak power density both time and spatially compressed in the vicinity of the light focus point. When laser beam 220 transmitting through wafer 100 exceeds a peak power density during the condensing process, a nonlinear absorption effect may cause a phenomenon, in which extremely high absorption occurs at localized points. By optimizing the laser and optical system characteristics to cause the nonlinear absorption effect just in the vicinity of the focal point inside wafer 100, it may be possible that only localized points or regions 115 in the separation line region 102 of wafer 100 will be selectively laser-machined without damaging layers or structures in wafer 100 located above or below those points or regions 115. Illustratively, regions 115 of wafer 100 may be laser-machined by laser beam 220, while other areas of wafer 100 may be unaffected by laser beam 220.

Laser beam 220 may enter wafer 100 from the back side 100b of wafer 100, as shown in view 300 of FIG. 3 and view 320 of FIG. 4A.

It should be noted that view 300 of FIG. 3 shows one and the same laser beam 220 at two different locations (corresponding to two different points in time), and arrow 221 indicates movement of the laser beam 220's position relative to wafer 100. Although typically a single laser beam will be used for dicing, it should be noted that, in principle, it may be possible to use a plurality of laser beams simultaneously.

In the example shown, laser-machined regions 115 of wafer 100 are shown as being arranged in two parallel layers or levels 116. However, it may also be possible that regions 115 are arranged in only one layer or level, or in more than two layers or levels, depending for example on the material and/or thickness of wafer 100.

As shown in view 320 of FIG. 4A, it may be possible that one or more pads 103 may be located in separation line region 102 of wafer 100, the pad(s) 103 possibly containing a thick or very thick metallization layer or area (e.g. very thick last metal), which may be difficult to separate well by means of laser stealth dicing. For example, separating the die regions 101a, 101b along separation line region 102 after application of laser beam 220, e.g. by means of a tape expander, (as indicated by arrows 222 in view 340 of FIG. 4B) may involve rupturing a thick metal of metal pad(s) 103 located in separation line region 102, which may be difficult and/or cause damage, e.g. cracks or chipping, in remaining portions 102' of separation line region 102, which may propagate to the dies or chips.

One or more embodiments may provide a concept of implementing an easy-to-crack position into one or more metallization structures, e.g. metal plates, e.g. pads (e.g. metal pads), for example testline pads, for example without modification of a process flow and/or without affecting probing conditions significantly. One or more embodiments may be applied to process flows with thick last metal (e.g. aluminum) connected by a via (e.g. aluminum via) to lower metal layers (e.g. aluminum or copper).

An effect of one or more embodiments may be that a layout for a metallization structure, e.g. metal plate, e.g. pad (e.g. PCM or testline pad), for example a metal pad having thick metal (e.g. aluminum), may be provided, which may be compatible with laser stealth dicing.

According to one or more embodiments, a layout of metallization structures such as metal plates, e.g. pad such as PCM (process control monitoring) or testline pads may be slightly changed to achieve an easy-to-crack position inside the metallization structures (e.g. metal plates, e.g. pads). In particular, in accordance with one or more embodiments, at least one opening (e.g. slit (e.g., trench), hole, perforation) may be formed in a metallization structure (e.g. a metal plate, e.g. a pad) by suitably modifying the layout of the metallization structure (e.g. layout of the metal plate, e.g. pad layout), but without adding additional process steps to a standard process flow.

In one or more embodiments, a metallization structure, for example a metal plate, for example a pad, for example a metal pad (e.g. PCM or testline pad), may include at least one opening, wherein a separation line region may intersect the opening. In one or more embodiments, the at least one opening may include or may be at least one hole. In one or more embodiments, the at least one hole may include or may be at least one through hole. In one or more embodiments, the at least one hole may include or may be at least one blind hole. In one or more embodiments, the at least one opening may include or may be at least one slit. In one or more embodiments, the at least one slit may include or may be at least one trench. In one or more embodiments, the at least one slit may be located in the center of the metallization structure (e.g. metal plate, e.g. pad, e.g. metal pad, e.g. testline pad). In one or more embodiments, the at least one slit may extend in a longitudinal direction of the separation line region. In one or more embodiments, the at least one opening may include or may be at least one perforation.

According to one or more embodiments, the thickness of a metallization structure (e.g. metal plate, e.g. pad), for example the thickness of a last thick metal layer (e.g. last thick aluminum layer) of a metal pad, e.g. a PCM or testline pad, may be locally reduced in at least one region of the metallization structure (e.g. metal plate, e.g. pad, e.g. metal pad) being intersected by at least one separation line region.

Figure 5A:
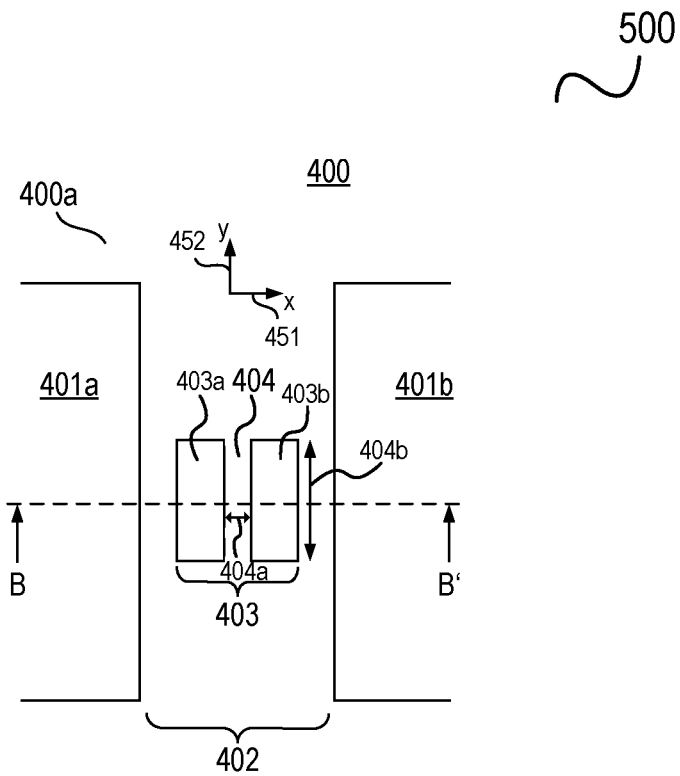
FIG. 5A shows a plan view of a section of a wafer in accordance with one or more embodiments.
Figure 5B:
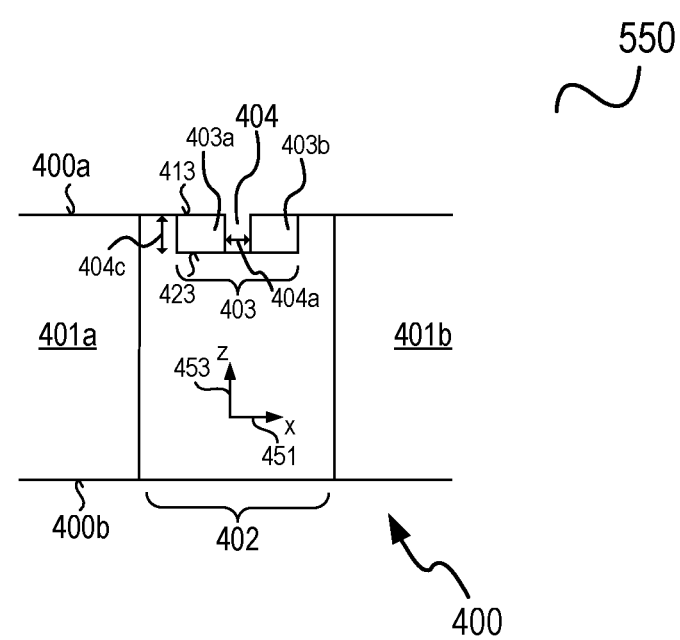
FIG. 5B shows a cross-sectional view along line B-B' in FIG. 5A.

FIG. 5A, shows a plan view 500 of a section of a wafer 400 in accordance with one or more embodiments, and FIG. 5B shows a cross-sectional view 550 of the section of wafer 400 taken along line B-B' in FIG. 5A.

Wafer 400 may include at least one metallization structure 403. In one or more embodiments, metallization structure 403 may be include or may be a pad 403. Pad 403 may include at least one opening 404. Wafer 400 may further include at least one separation line region 402, along which wafer 400 is to be diced. Separation line region 402 may intersect opening 404.

Opening 404 may be formed in pad 403 prior to dicing wafer 400. In other words, opening 404 may be formed in pad 403 before a dicing process is carried out. In particular, opening 404 may be formed by some process other than a dicing process.

In one or more embodiments, pad 403 may include or may consist of at least one metal such as, for example, aluminum, copper, gold, silver, tin, palladium, zinc, nickel, iron, titanium, or an alloy including at least one of the aforementioned metals, e.g. AlCu or AlSiCu. A pad including or consisting of a metal or metal alloy may also be referred to as a metal pad. In accordance with other embodiments, pad 403 may include other materials, e.g. other metals or metal alloys. In one or more embodiments, pad 403 may include or may be a single layer, including or consisting of, for example, at least one of the aforementioned materials, e.g. metals or metal alloys. In one or more embodiments, pad 403 may include or may be a layer stack including a plurality of layers, each layer of the layer stack including or consisting of for example, at least one of the aforementioned materials, e.g. metals or metal alloys.

Wafer 400 may be to some degree similar to wafer 100 shown in FIG. 1. For example, wafer 400 may include a front side 400a and a back side 400b. In one or more embodiments, pad 403 may be disposed at the front side 400a of wafer 400, as shown. The section of wafer 400 shown in FIG. 5A may, for example, correspond to section 200 of wafer 100. Region 401a may be a first die region of wafer 400 and may, for example, be similar to first die region 101a of wafer 100. Region 401b may be a second die region of wafer 400 and may, for example, be similar to second die region 101b of wafer 100. Separation line region 402 may, for example, be similar to separation line region 102 of wafer 100.

Pad 403 may be to some degree similar to pad 103 of wafer 100. For example, pad 403 may serve to electrically connect one or more electrical devices, e.g. test devices (not shown), which may be placed in separation line region 402, for example in one or more layers or levels below pad 403. To this end, pad 403 may be connected to the one or more electrical devices, e.g. by one or more electrical interconnects and/or vias (not shown), which may be located in one or more layers or levels below pad 403.

In contrast to pad 103 of wafer 100, pad 403 of wafer 400 may include opening 404. Opening 404 may be intersected by separation line region 402.

In one or more embodiments, opening 404 may be located at a center or middle of pad 403. For example, in one or more embodiments, opening 404 may divide pad 403 into a first part 403a and a second part 403b, for example into two halves. In one or more embodiments, the first and second parts 403a, 403b of pad 403 may have the same or substantially the same size (e.g. surface area). In one or more embodiments, first and second parts 403a, 403b of pad 403 may be located on either side of a separation line (e.g. scribe line) that may be generated upon dicing wafer 400. In other words, first part 403a of pad 403 may be located on one side of the separation line (e.g. scribe line), and second part 403b of pad 403 may be located on another side of the separation line (e.g. scribe line).

In one or more embodiments, a position of opening 404 may correspond to a position of a center or middle of separation line region 402.

In one or more embodiments, wafer 400 may include at least one test structure (not shown) connected to pad 403, wherein separation line region 402 may intersect the test structure.

In one or more embodiments, the test structure may be configured as a process control monitor (PCM) structure.

In one or more embodiments, pad 403 may be configured as a process control monitor (PCM) pad.

In one or more embodiments, a dimension 404a of opening 404 in a transverse direction 451 ("x" direction in FIG. 5A and FIG. 5B) of separation line region 402 (e.g. a width of opening 404) may be less than a dimension of separation line region 402 in the transverse direction 451 of separation line region 402 (e.g. a width of separation line region 402).

In one or more embodiments, the dimension 404a of opening 404 in the transverse direction 451 of separation line region 402 (e.g. the width of opening 404) may be less than or equal to about 15 µm, for example in the range from about 1 µm to about 15 µm according to one embodiment, for example in the range from about 5 µm to about 10 µm according to one embodiment, although other values may be possible as well in accordance with other embodiments, for example less than or equal to about 1 m according to one embodiment, or greater than or equal to about 15 µm according to one embodiment.

In one or more embodiments, pad 403 (for example, a metal layer (e.g. last metal layer) of pad 403) may have a thickness of greater than or equal to about 1 µm, for example in the range from about 1 µm to about 3 µm according to one embodiment, although other values of the thickness may be possible as well in accordance with other embodiments, for example less than 1 µm or greater than 3 µm. In one or more embodiments, the aforementioned "thickness" may refer to a thickness of a last (or, topmost) metallization layer or level (e.g. Metal-N) of a metallization layer stack. It may be understood that the metallization layer stack may include one or more additional metallization layers or levels (e.g. Metal-(N−1), Metal-(N−2), ..., Metal-1) aside from the last metallization layer or level (not shown in FIGS. 5A and 5B, see e.g. FIG. 11E), and possibly one or more vertical interconnects (vias) between neighboring metallization layers or levels, e.g. between Metal-N and Metal-(N−1), between Metal-(N−1) and Metal-(N−2), etc. It may be understood that a total thickness of the metallization layer stack (including all of the metallization layers/levels and possibly vias) may be greater than the thickness of the last metallization layer alone.

In one or more embodiments, a depth 404c of opening 404 may be equal or substantially equal to a thickness of pad 403, for example equal or substantially equal to a thickness of a last thick metal layer. In one or more embodiments, the depth 404c of opening 404 or the thickness of pad 403 may refer to a dimension of opening 404 and/or a dimension of pad 403 in a direction 453 ("z" direction in FIG. 5B) perpendicular to a main processing surface of wafer 400, for example a direction 453 perpendicular to the front side 404a of wafer 400. Direction 453 may, for example, be perpendicular to both the transverse direction 451 ("x" direction) and a longitudinal direction 452 ("y" direction in FIG. 5A) of separation line region 402. For example, opening 404 may reach through the entire thickness of pad 403. For example, opening 404 may reach from a top side 413 of pad 403 to a lower side 423 of pad 403, as shown.

Figure 7A:
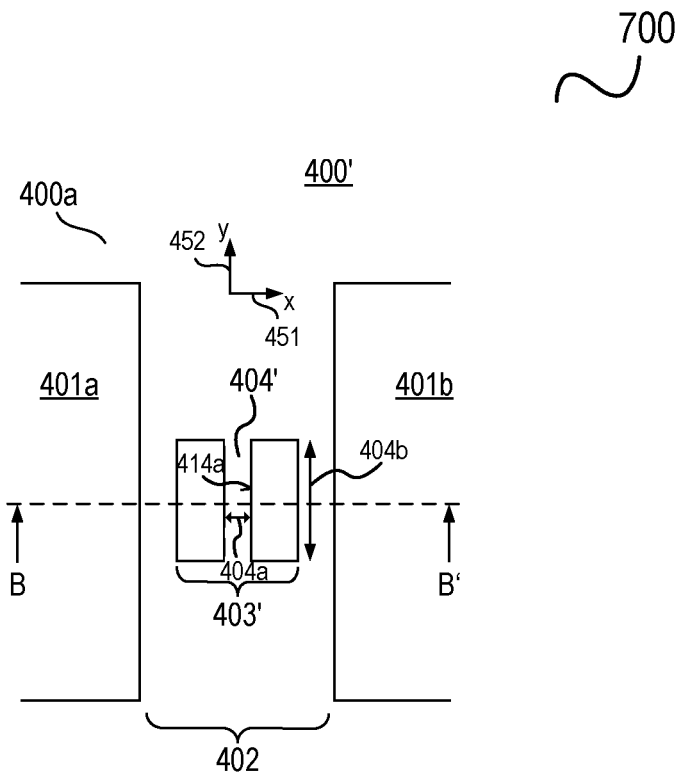
FIG. 7A shows a plan view of a section of a wafer in accordance with one or more embodiments.
Figure 7B:
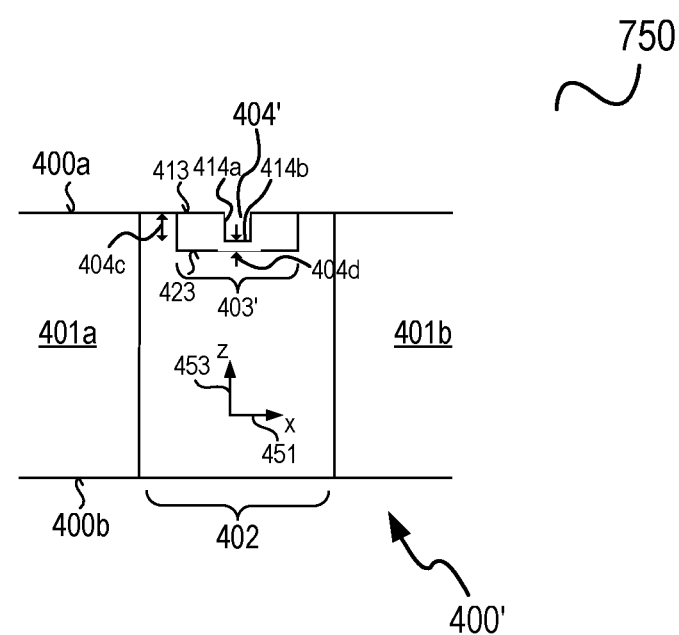
FIG. 7B shows a cross-sectional view along line B-B' in FIG. 7A.

In accordance with other embodiments, depth 404c of opening 404 may be less than a thickness of pad 403 (not shown, see e.g. FIG. 7B).

In one or more embodiments, a dimension 404b of opening 404 in the longitudinal direction 452 ("y" direction in FIG. 5A) of separation line region 402 (e.g. a length of opening 404) may be equal or substantially equal to a dimension of pad 403 in the longitudinal direction 452 of separation line region 402 (e.g. a length of pad 403). For example, opening 404 may span the entire pad 403 in the longitudinal direction 452 of separation line region 402.

In one or more embodiments, opening 404 may include or may be a slit extending in the longitudinal direction 452 of separation line region 402, as shown in view 500 of FIG. 5A.

In one or more embodiments, a length of the slit may be equal or substantially equal to a dimension (e.g. length) of pad 403 in the longitudinal direction 452 of separation line region 402, as shown in view 500 of FIG. 5A In other embodiments, a length of the slit may be less than a length of pad 403.

Opening 404 in pad 403 may provide an easy-to-crack position when dicing wafer 400, for example by means of laser stealth dicing, along separation line region 402 as will be described below.

Figure 6A:
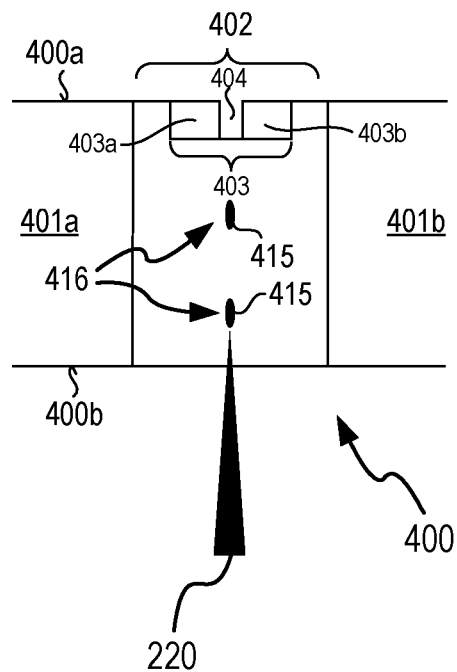
FIG. 6A and FIG. 6B show various views for illustrating a stealth dicing process applied to the wafer of FIGS. 5A and 5B, for illustrating an aspect of one or more embodiments.
Figure 6B:
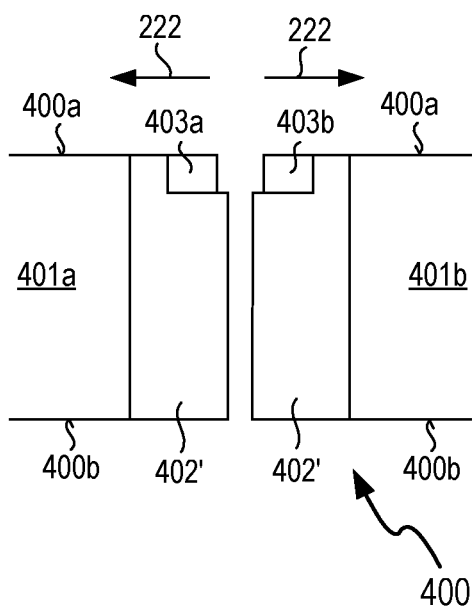

FIG. 6A and FIG. 6B show views 620 and 640, respectively, illustrating a laser stealth dicing process applied to wafer 400, for illustrating an aspect of one or more embodiments.

Similarly as described above in connection with FIG. 3, FIG. 4A and FIG. 4B, laser stealth dicing wafer 400 may include laser-machining localized points or regions 415 in separation line region 402 of wafer 400 by laser beam 220, as shown in view 620 of FIG. 6A, and separating the die regions 401a, 401b along separation line region 402 after application of laser beam 220, e.g. by means of a tape expander, as indicated by arrows 222 in view 640 of FIG. 6B.

Laser beam 220 may enter wafer 400 from the back side 400b of wafer 400, as shown in view 620 of FIG. 6A.

In the example shown, the laser-machined regions 415 are shown as being arranged in two parallel layers or levels 416. However, it may also be possible that regions 415 are arranged in only one layer or level, or in more than two layers or levels, depending for example on the material and/or thickness of wafer 400.

As shown in view 620 of FIG. 6A, pad 403 having opening 404 may be located in separation line region 402 of wafer 400. Pad 403 may, for example, include or be a thick or very thick metallization layer or area (e.g. very thick last metal). Normally, such thick or very thick metallization layers or areas may be difficult to separate well by means of laser stealth dicing, as described above in connection with FIG. 4A and FIG. 4B. However, pad 403 of wafer 400 includes opening 404, which may provide an easy-to-crack position. Thus, separating die regions 401a, 401b along separation line region 402 may be carried out easily without the need to rupture a thick metal of pad 403. Illustratively, pad 403 may have been (at least partially) pre-divided or separated by opening 404 in pad 403, before dicing wafer 400. Therefore, separating die regions 401a and 401b along separation line region 402, e.g. by a tape expander, may involve only rupturing of layers or material of wafer 400, which may crack relatively easily, for example semiconductor (e.g. silicon) layers, dielectric layers, or thin metal layers (e.g. metal layers of lower metallization levels having a small thickness). Therefore, damage, e.g. cracks and/or chipping, in remaining portions 402' of separation line region 402 may, for example, be prevented or substantially reduced.

FIG. 7A shows a plan view 700 of a section of a wafer 400' in accordance with one or more embodiments, and FIG. 7B shows a cross-sectional view 750 of the section of wafer 400' taken along line B-B' in FIG. 7A.

Wafer 400' may be to some degree similar to wafer 400 shown in FIG. 5A and FIG. 5B. In particular, the same reference signs may denote the same or similar elements as there and will not be described in detail again here. Reference is made instead to the description above.

Wafer 400' may include at least one metallization structure 403'. In one or more embodiments, metallization structure 403' may include or may be a metal plate. In one or more embodiments, metallization structure 403' may include or may be a pad. In the following, metallization structure 403' is described as being a pad 403'. Pad 403' may include at least one opening 404'. Separation line region 402 may intersect opening 404'.

Opening 404' may be formed in pad 403' prior to dicing wafer 400'. In other words, opening 404' may be formed in pad 403' before a dicing process is carried out. In particular, opening 404' may be formed by some process other than a dicing process.

Pad 403' may be similar to pad 403 of wafer 400 except that depth 404c of opening 404' may be less than a thickness of pad 403', as shown. In one or more embodiments, opening 404' may be configured as a slit (e.g. trench) having one or more sidewalls 414a and a bottom wall 414b.

As shown, opening 404' may reach only through a part of the thickness of pad 403'. Opening 404' may reach from top side 413 of pad 403' down to bottom wall 414b of opening 404', which may be located above lower side 423 of pad 403'.

Thus, in one or more embodiments, a distance 404d between bottom wall 414b of opening 404' and lower side 423 of pad 403', corresponding for example to a thickness of pad 403' in a region below opening 404', may be non-zero and may, for example be less than or equal to about 2 µm, for example less than or equal to about 1 µm, for example less than or equal to about 500 nm, for example less than or equal to about 200 nm, for example less than or equal to about 100 nm, for example less than or equal to about 50 nm, for example less than or equal to about 10 nm, for example in the range from about 10 nm to about 2 µm, for example in the range from about 10 nm to about 1 µm, for example in the range from about 10 nm to about 500 nm, for example in the range from about 10 nm to about 200 nm, for example in the range from about 10 nm to about 100 nm, for example in the range from about 10 nm to about 50 nm, although other values may be possible as well in accordance with other embodiments.

In one or more embodiments, a dimension 404b of opening (e.g. slit (e.g. trench)) 404' in the longitudinal direction 452 ("y" direction in FIG. 6A) of separation line region 402 (e.g. a length of opening 404') may be equal or substantially equal to a dimension of pad 403' in the longitudinal direction 452 of separation line region 402 (e.g. a length of pad 403'), as shown. For example, opening (e.g. slit (e.g. trench)) 404' may span the entire pad 403' in the longitudinal direction 452 of separation line region 402. In accordance with other embodiments, dimension 404b of opening 404' may be less than the dimension of pad 403' in the longitudinal direction 452 of separation line region 402.

Opening 404' in pad 403' may provide an easy-to-crack position when dicing wafer 400' along separation line region 402, for example by means of laser stealth dicing, as described above. In particular, by means of forming opening 404' in pad 403', a portion of pad 403' (for example, a center portion of pad 403') may be thinned, and thus pad 403' may be easily separated when separating die regions 401a and 401b along separation line region 402, for example in a laser stealth dicing process for dicing wafer 400', for example similar as described above in connection with FIG. 6A and FIG. 6B.

Figure 8:
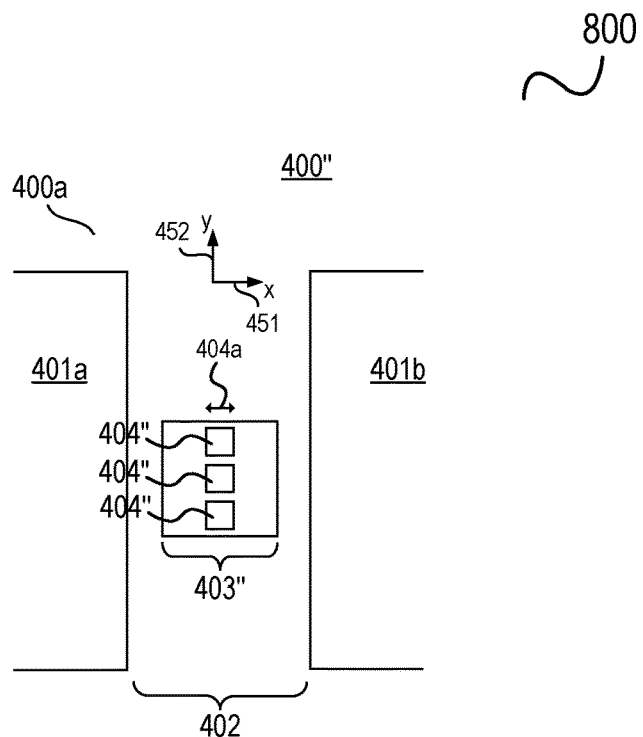
FIG. 8 shows a plan view of a section of a wafer in accordance with one or more embodiments.

FIG. 8 shows a plan view of a section of a wafer 400" in accordance with one or more embodiments.

Wafer 400" may be to some degree similar to wafer 400 shown in FIG. 5A and FIG. 5B, and/or wafer 400' shown in FIG. 7A and FIG. 7B. In particular, the same reference signs may denote the same or similar elements as there and will not be described in detail again here. Reference is made instead to the description above.

Wafer 400" may include at least one metallization structure 403". In one or more embodiments, metallization structure 403" may include or may be a metal plate. In one or more embodiments, metallization structure 403" may include or may be a pad. In the following, metallization structure 403" is described as being a pad 403". Pad 403" may include a plurality of openings 404" (three openings 404" are shown as an example, however the number of openings 404' may be different, for example greater than or equal to two, in general). Separation line region 402 may intersect the plurality of openings 404".

Openings 404" may be formed in pad 403" prior to dicing wafer 400". In other words, openings 404" may be formed in pad 403" before a dicing process is carried out. In particular, openings 404" may be formed by some process other than a dicing process.

In one or more embodiments, openings 404" may be holes. In one or more embodiments, one or more, e.g. all, of the holes 404" may be through holes, i.e. reaching through the entire thickness of pad 403" (similar to opening 404 in pad 403). In one or more embodiments, one or more, e.g. all, of the holes 404" may be blind holes, i.e. reaching only through a part of the thickness of pad 403" (similar to opening 404' in pad 403').

In one or more embodiments, openings 404" may be aligned in the longitudinal direction 452 of separation line region 402. For example, openings 404" may be arranged to form a chain. In one or more embodiments, openings 404" may be equally spaced.

In one or more embodiments, a dimension 404a of one or more, e.g. all, of the openings 404" in the transverse direction 451 of separation line region 402 may be similar as described above for opening 404 in pad 403.

In one or more embodiments, openings 404" may all have the same shape (e.g. same cross-sectional shape) and/or the same size (e.g. same length, width and/or depth). In one or more embodiments, at least one of openings 404" may have a different shape (e.g. different cross-sectional shape) and/or size (e.g. different length, width and/or depth) than the other openings 404".

Illustratively, pad 403" of wafer 400" may have a perforated structure including a plurality of openings 404" (e.g.

holes (e.g. through holes and/or blind holes)). Openings 404" in pad 403" may provide an easy-to-crack position when dicing wafer 400", for example by means of laser stealth dicing, as described above.

Figure 9:
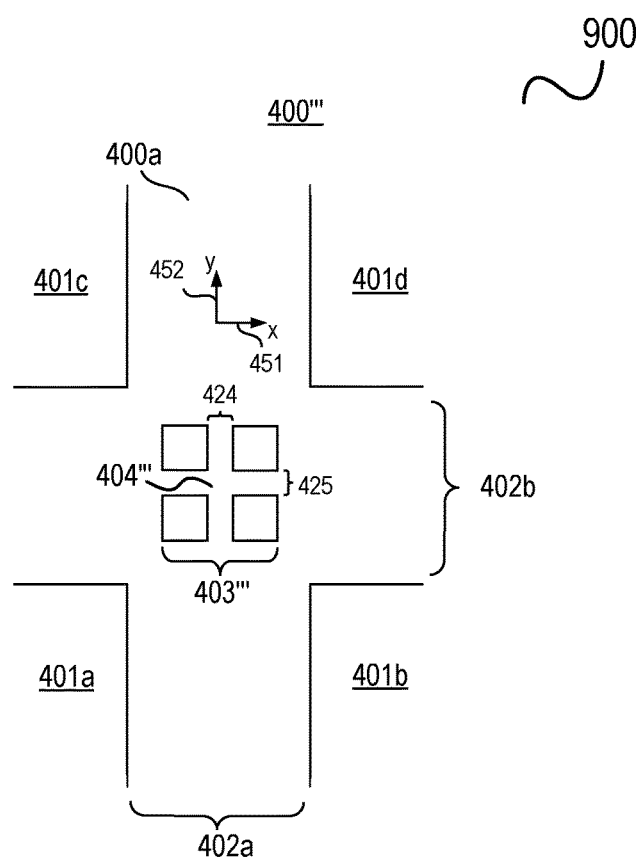
FIG. 9 shows a plan view of a section of a wafer in accordance with one or more embodiments.

FIG. 9 shows a plan view of a wafer 400''' in accordance with one or more embodiments.

Wafer 400''' may be to some degree similar to wafer 400, wafer 400', and/or wafer 400". In particular, the same reference signs may denote the same or similar elements as there and will not be described in detail again here. Reference is made instead to the description above.

Wafer 400''' may include at least one metallization structure 403'''. In one or more embodiments, metallization structure 403''' may include or may be a metal plate. In one or more embodiments, metallization structure 403''' may include or may be a pad. In the following, metallization structure 403''' is described as being a pad 403'''. Pad 403''' may include at least one opening 404'''. Wafer 400''' may further include at least a first separation line region 402a and a second separation line region 402b, along which wafer 400''' is to be diced. Opening 404''' may include a first portion 424 extending in a longitudinal direction ("y" direction 452 in FIG. 9) of the first separation line region 402a and a second portion 425 extending in a longitudinal direction ("x" direction 451) of the second separation line region 402b. In one or more embodiments, the first portion 424 and the second portion 425 of opening 404''' may intersect at an intersection of the first separation line region 402a and the second separation line region 402b. In one or more embodiments, first portion 424 and second portion 425 of opening 404''' may be configured as first and second slits, respectively, for example spanning pad 403''', wherein the first and second slits may be aligned along the longitudinal directions of the first and second separation line regions 402a, 402b, respectively.

Illustratively, pad 403''' including opening 404''' may be located at an intersection of two separation line regions 402a, 402b, along which wafer 400''' is to be diced. In one or more embodiments, one or more die regions 401 may be located adjacent or proximate to the intersection of the separation line regions 402a, 402b. As an example, first to fourth die regions 401a, 401b, 401c, 401d are shown in FIG. 9, however the number of neighboring die regions 401 may be different from four, for example one, two, or three in accordance with some embodiments.

Opening 404''' may be formed in pad 403''' prior to dicing wafer 400'''. In other words, opening 404''' may be formed in pad 403''' before a dicing process is carried out. In particular, opening 404''' may be formed by some process other than a dicing process.

In one or more embodiments, opening 404''' may reach through the entire thickness of pad 403''' (similar to opening 404 in pad 403). In one or more embodiments, opening 404''' may reach only through a part of the thickness of pad 403''' (similar to opening 404' in pad 403').

In one or more embodiments, a dimension of the first portion 424 of opening 404''' in the transverse direction ("x" direction 451) of the first separation line region 402a, and/or a dimension of the second portion 425 of opening 404''' in the transverse direction ("y" direction 452) of the second separation line region 402b may be similar as dimension 404a of opening 404 in pad 403.

Opening 404''' including first portion 424 (e.g. first slit) and second portion 425 (e.g. second slit) may provide an easy-to-crack position when dicing wafer 400", for example by means of laser stealth dicing, along first and/or second separation line regions 402a, 402b.

Figure 10:
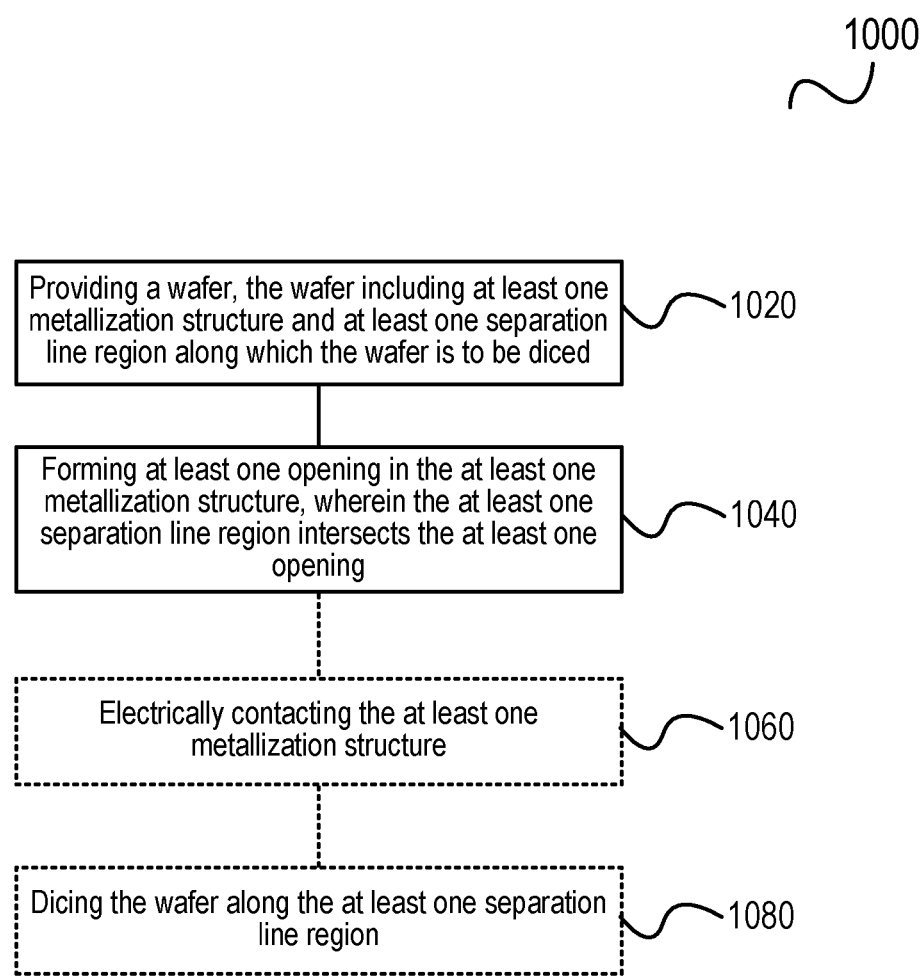
FIG. 10 shows a method for processing a wafer in accordance with one or more embodiments.

FIG. 10 shows a method 1000 for processing a wafer in accordance with one or more embodiments.

In 1020, a wafer may be provided, the wafer including at least one metallization structure and at least one separation line region along which the wafer is to be diced.

In 1040, at least one opening may be formed in the at least one metallization structure, wherein the at least one separation line region intersects the at least one opening.

In one or more embodiments, the at least one opening may include or may be at least one hole. In one or more embodiments, the at least one hole may include or may be at least one through hole. In one or more embodiments, the at least one hole may include or may be at least one blind hole. In one or more embodiments, the at least one opening may include or may be at least one slit. In one or more embodiments, the at least one slit may include or may be at least one trench. In one or more embodiments, the at least one opening may include or may be at least one perforation.

In one or more embodiments, the at least one metallization structure may include or may be at least one metal plate. In one or more embodiments, the at least one metallization structure may include or may be at least one pad.

In one or more embodiments, method 1000 may further include (in 1060) electrically contacting the at least one metallization structure after forming the at least one opening in the at least one metallization structure and before dicing the wafer along the at least one separation line region.

In one or more embodiments, electrically contacting the at least one metallization structure may include contacting the at least one metallization structure with a probe.

In one or more embodiments, method 1000 may further include (in 1080) dicing the wafer along the at least one separation line region after forming the at least one opening in the at least one metallization structure.

In one or more embodiments, dicing the wafer along the at least one separation line region may include or may be achieved by stealth dicing the wafer along the at least one separation line region.

In one or more embodiments, the at least one metallization structure (e.g. metal plate, e.g. pad) may include or may consist of at least one metal or metal alloy.

Method 1000 may further be configured in accordance with one or more embodiments described herein.

FIG. 11A to FIG. 11H show various views illustrating a method for processing a wafer in accordance with one or more embodiments.

Figure 11A:
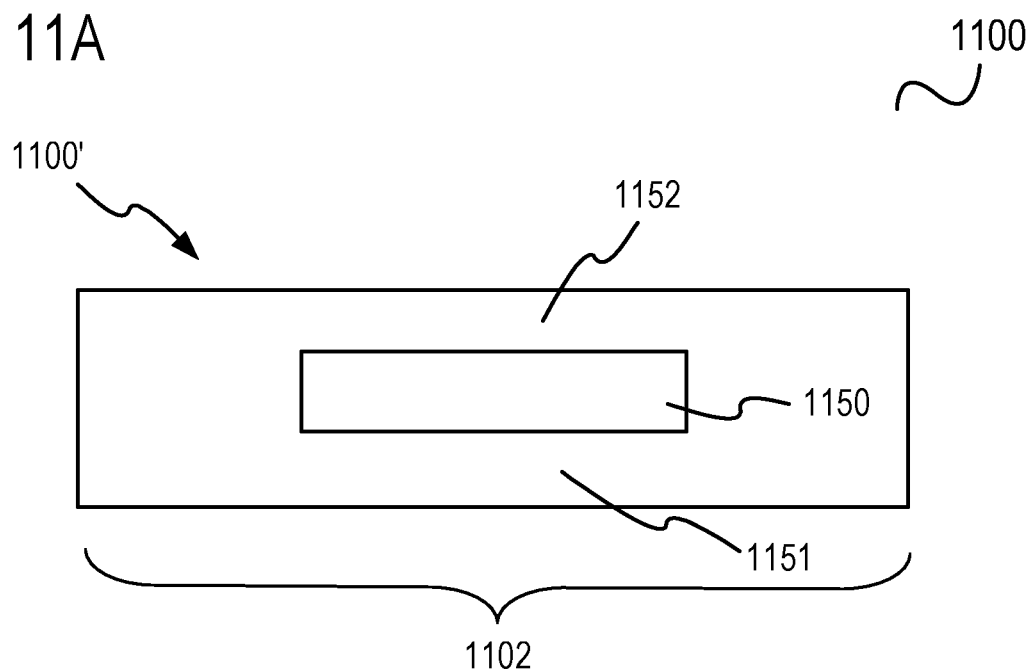
FIG. 11A to FIG. 11H show various views illustrating a method for processing a wafer in accordance with one or more embodiments.

As shown in FIG. 11A in a view 1100, a wafer 1100' may be provided. Wafer 1100' may include a separation line region 1102, for example a kerf region or scribe line region, along which wafer 1100' is to be diced.

Wafer 1100' may include a metallization layer 1150, which may be located at least partially in separation line region 1102. In one or more embodiments, metallization layer 1150 may be a second to last metallization layer of wafer 1100' (also referred to as Metal-(N−1), with N being a last metallization level of wafer 1100'). Metallization layer 1150 may include one or more metallization structures such as, for example, one or more electrical interconnects. Metallization layer 1150 may, for example, be electrically connected to one or more other metallization layers (e.g. N−2, N−3, . . . , etc.) and/or one or more electrical or electronic devices or structures of wafer 1100' located below metallization layer 1150 (not shown). In one or more embodiments, metallization layer 1150 may include or consist of a metal or metal alloy such as, for example, Al, Cu, AlCu, or AlSiCu, although other materials (e.g. metals or metal alloys) may be possible as well. In one or more embodiments, a liner layer (including or consisting of for example, Ti, TiN, or TaN, although other materials may be possible as well) may be disposed over at least part of metallization layer 1150, e.g. over a top side of metallization layer 1150 (not shown).

In one or more embodiments, metallization layer 1150 may have a thickness in the range from about 400 nm to about 1.5 µm, although other thicknesses (e.g. less than 400 nm or greater than 1.5 µm) may be possible as well in accordance with other embodiments, depending for example on the material(s) of metallization layer 1150, and/or on the process technology used.

One or more intermetal dielectric (IMD) layers 1151 may be interposed between metallization layers of wafer 1100". As shown in FIG. 11A, an IMD layer 1152 may be deposited over metallization layer 1150. In one or more embodiments, IMD layer 1152 may be a last IMD layer of wafer 1100'.

Figure 11B:
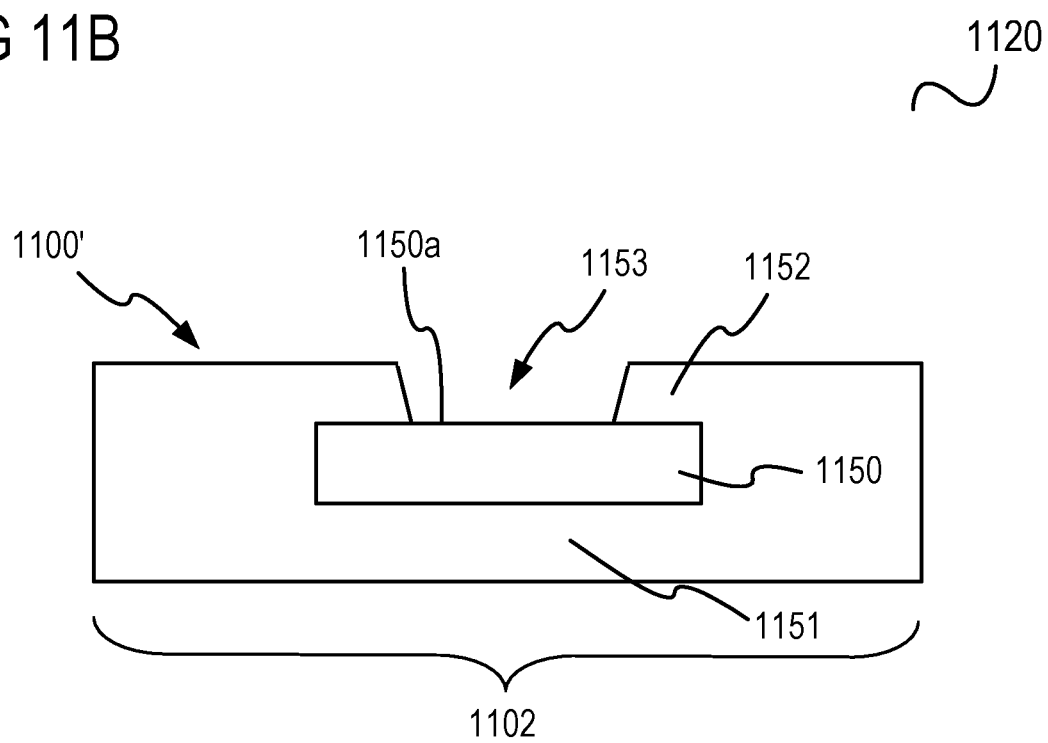

As shown in FIG. 11B in a view 1120, at least part of IMD layer 1152 may be removed to form an opening 1153 in IMD layer 1152. Opening 1153 may expose at least part of metallization layer 1150, for example at least part of a top side 1150a of metallization layer 1150. In one or more embodiments, removing at least part of IMD layer 1152 may include or may be achieved by etching. For example, in one or more embodiments opening 1153 may be formed using a via etch process.

Figure 11C:
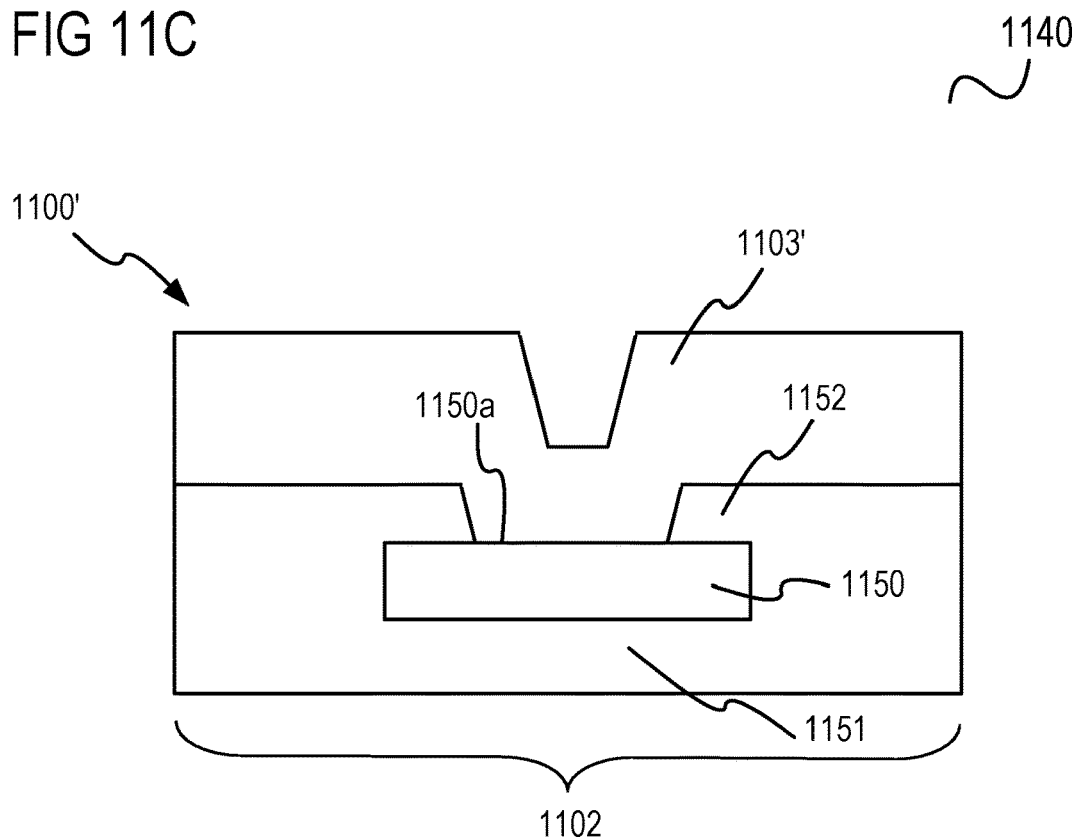

As shown in FIG. 11C in a view 1140, a metallization layer 1103' may be deposited over IMD layer 1152 and the exposed part of metallization layer 1150. In one or more embodiments, metallization layer 1103' may include or may be a last metallization layer (also referred to as Metal-N, with N being a last metallization level of wafer 1100'). In one or more embodiments, metallization layer 1103' may include aluminum (Al), although other metals or metal alloys may be possible as well in accordance with other embodiments.

In one or more embodiments, metallization layer 1103' may include or may be a thick last metal layer of wafer 1100'. For example, in one or more embodiments, metallization layer 1103' may have a thickness of greater than or equal to about 1 µm, for example in the range from about 1 µm to about 3 µm in some embodiments. However, other thicknesses may be possible as well in accordance with other embodiments.

Figure 11D:
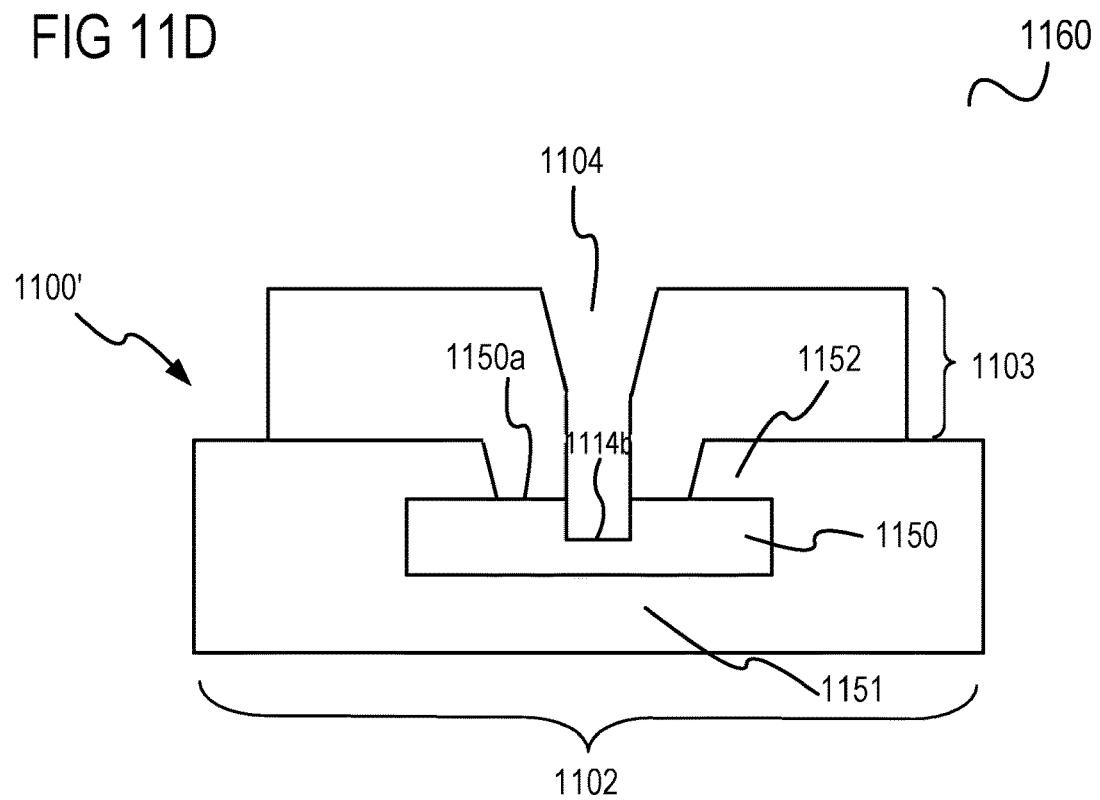

As shown in FIG. 11D in a view 1160, metallization layer 1103' may be patterned to form metallization structure 1103. In one or more embodiments, metallization structure 1103 may include or may be a metal plate. In one or more embodiments, metallization structure 1103 may include or may be a pad. In the following, metallization structure 1103 is described as being a pad 1103. In one or more embodiments, patterning metallization layer 1103' may include or may be achieved by etching metallization layer 1103' using an etch mask, which may for example be defined using a photolithographic process.

Patterning metallization layer 1103' to form pad 1103 may include forming at least one opening 1104 in metallization layer 1103'. In one or more embodiments, opening 1104 may reach through a part of the thickness of metallization layer 1103'. In this case, a non-zero distance may be between bottom wall 1114b of opening 1104 and top side 1150a of metallization layer 1150. In one or more embodiments, opening 1104 may reach through the entire thickness of metallization layer 1103'. In one or more embodiments, opening 1104 may reach down to the top side 1150a of metallization layer 1150' (or down to a top side of a liner layer (not shown) disposed over metallization layer 1150'), or even at least partially into metallization layer 1150' in some embodiments (as shown). In the latter case, bottom wall 1114b may be located below top side 1150a of metallization layer 1150, as shown. It may be understood that the depth of opening 1104 may be influenced or controlled by a number of factors such as, for example, depth of opening 1153, overetch during patterning of opening 1153, and/or dimensioning of opening 1104 (for example, a greater width may typically lead to a greater depth). In one or more embodiments, opening 1104 may be a slit spanning pad 1103 in a longitudinal direction of separation line region 1102 (i.e. a direction perpendicular to the drawing plane of FIG. 11D).

Thus, patterning metallization layer 1103' may provide pad 1103 having at least one opening 1104. Patterning metallization layer 1103' may, for example, include etching metallization layer 1103' (e.g. etching last metal), e.g. using an etch mask to define pad 1103. In one or more embodiments, the etch mask may include at least one additional opening (compared to a number of openings in a standard etch mask used to define a pad), which may be used to define the at least one opening 1104 of pad 1103. In one or more embodiments, the at least one additional opening in the etch mask may be located along a center of separation line region 1102 (e.g. along a scribe line center). In other words, a position of the at least one opening in the etch mask may correspond to a center of separation line region 1102 (e.g. scribe line center). Accordingly, a position of the at least one opening 1104 in pad 1103 may correspond to a center of separation line region 1102 in accordance with one or more embodiments.

Figure 11E:
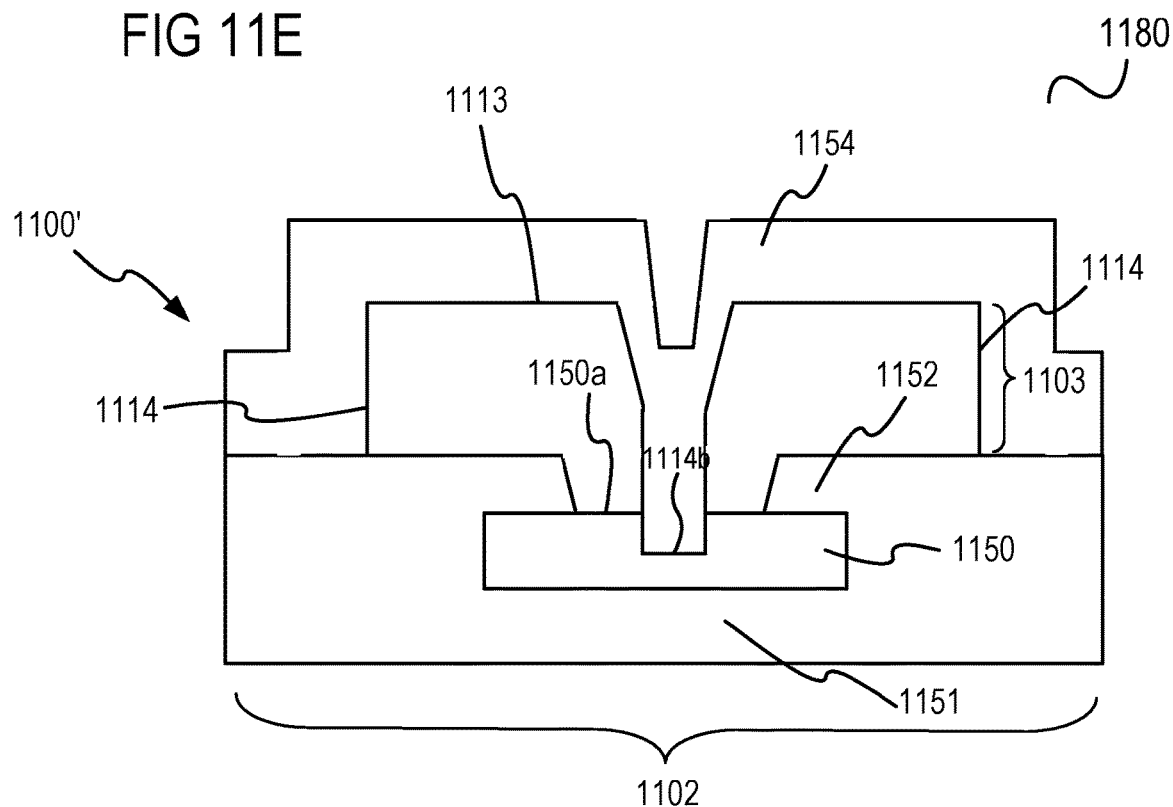

As shown in FIG. 11E in a view 1180, a passivation layer 1154 (e.g. a hard passivation, for example including or consisting of an oxide, a nitride, and/or an oxynitride material, although other materials may be possible as well) may be formed (e.g. deposited) over pad 1103. In one or more embodiments, passivation layer 1154 may, for example, cover a surface of pad 1103, e.g. one or more sidewalls 1114 and/or a top side 1113 of pad 1103. In one or more embodiments, passivation layer 1154 may fill opening 1104 at least partially, as shown.

Figure 11F:
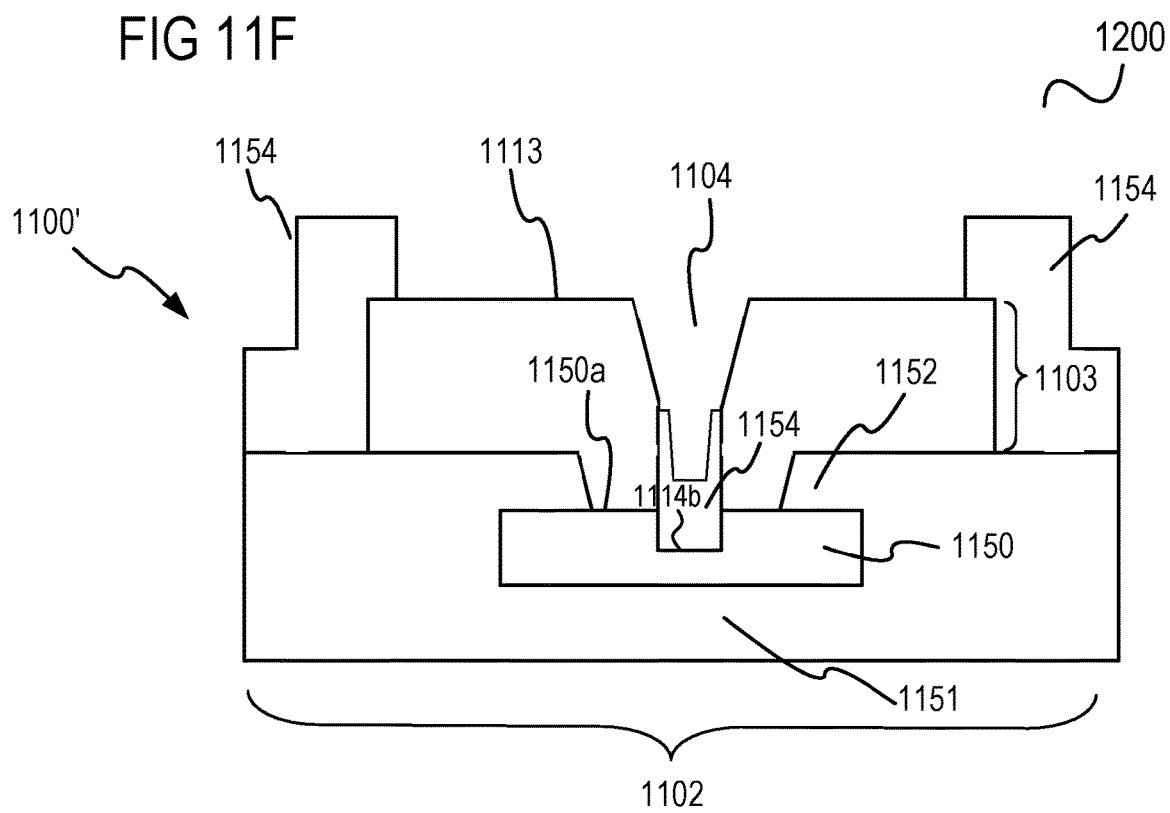

As shown in FIG. 11F in a view 1200, at least part of passivation layer 1154 may be removed to uncover at least part of pad 1103, for example uncover at least part of the top side 1113 of pad 1103. Removing passivation layer 1154 may, for example, include or be achieved by etching (passivation open etch). Part of passivation layer 1154 may remain over pad 1103, for example over one or more sidewalls 1114 of pad 1103 and/or over part of the top side 1113 of pad 1103, as shown. Furthermore, in one or more embodiments, part of passivation layer 1154 may remain in opening 1104, for example covering bottom wall 1114b and/or part of sidewalls of opening 1104.

Figure 11G:
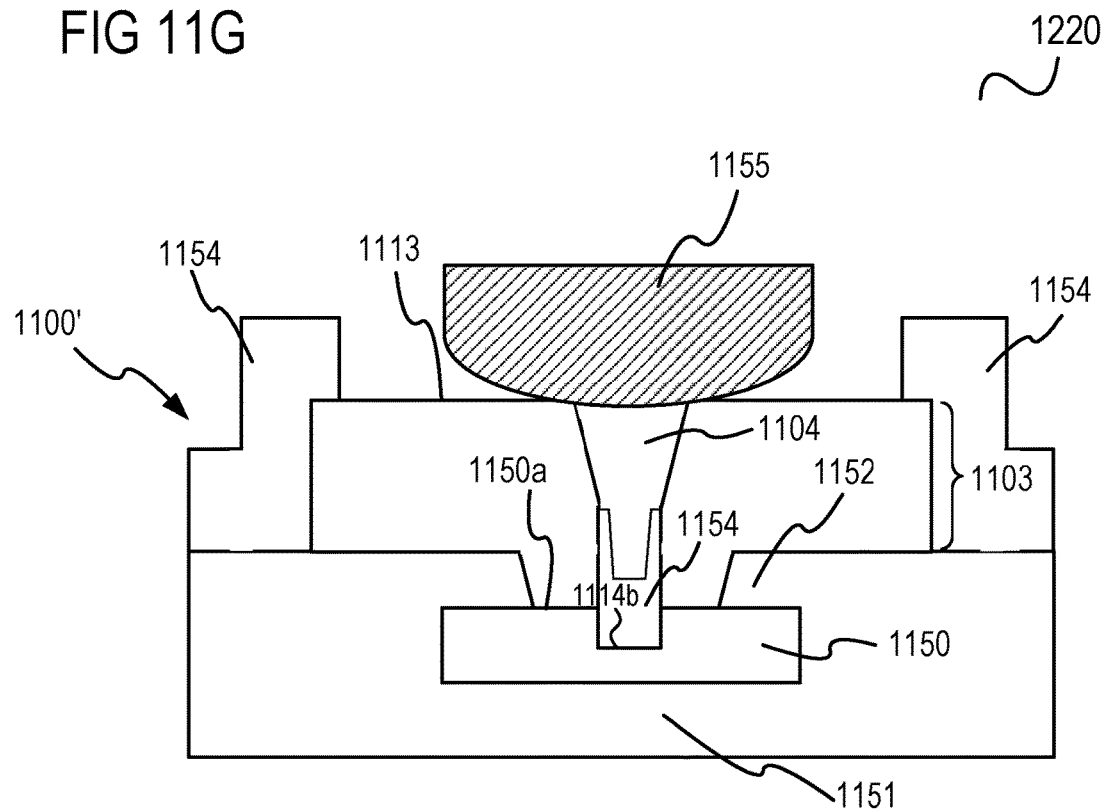

In one or more embodiments, pad 1103 may be configured as a PCM or testline pad and may, for example, serve to electrically contact one or more test structures (e.g. PCM structures). In one or more embodiments and as shown in FIG. 11G in a view 1220, pad 1103 (e.g. PCM or testline pad) may be electrically contacted by a probe 1155 for testing. In one or more embodiments, contacting pad 1103 may be carried out before dicing wafer 1100' along separation line region 1102. FIG. 11G shows that probing may still be feasible with pad 1103 having one or more openings 1104.

Figure 11H:
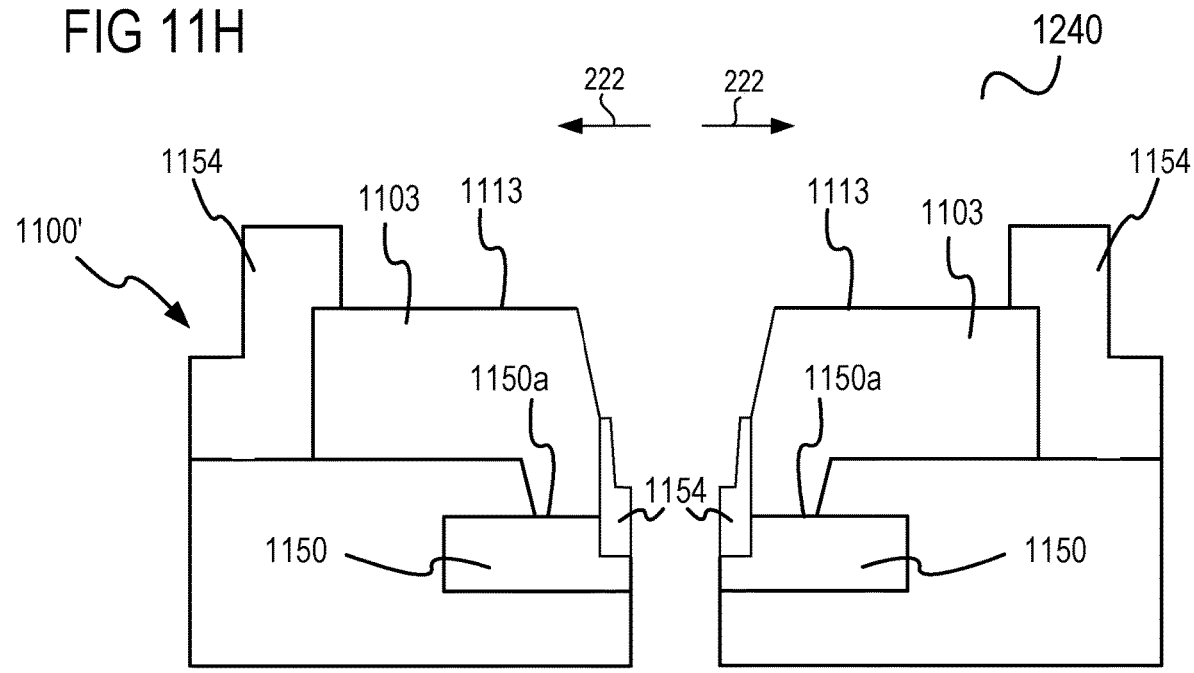

In one or more embodiments, wafer 1100' may be diced along separation line region 1102 (for example by means of laser stealth dicing). In one or more embodiments, dicing may be carried out after electrically contacting pad 1103 for testing. In the context of dicing, pad 1103 having opening 1104 may provide an easy-to-crack position of wafer 1100' in the center of separation line region 1102, e.g. in the center of a scribeline, as there may, for example, be no need to rupture a thick metal layer when separating pad 1103, as shown in FIG. 11H in a view 1240. In the embodiment shown in FIGS. 11A to 11H, opening 1104 is shown to reach all the way through metallization layer 1103' of pad 1103 and partially into (second-to-last) metallization layer 1150, wherein bottom wall 1114b of opening 1104 may be located below top side 1150a of metallization layer 1150. It may be understood, though, that in accordance with other embodiments, opening 1104 may reach only through a part of metallization layer 1103', wherein bottom wall 1114b of opening 1104 may be located at or above top side 1150a of metallization layer 1150 (or at or above a top side of a liner layer disposed over metallization layer 1150), as described above. In these cases, pad 1103 may also provide an easy-to-crack position, which may facilitate dicing (e.g. laser stealth dicing).

One aspect of the method for processing a wafer according to the embodiment illustrated hereinabove may be seen in that opening 1104 (e.g. slit (e.g. trench)) may be formed in pad 1103 (e.g. PCM or testline pad) without adding additional process steps to a standard process flow, but by suitably modifying the pad layout.

A wafer in accordance with various embodiments may include at least one metallization structure having at least one opening. The wafer may further include at least one separation line region along which the wafer is to be diced. The at least one separation line region may intersect the at least one opening.

In one or more embodiments, the at least one metallization structure may include or may be at least one metal plate.

In one or more embodiments, the at least one metallization structure may include or may be at least one pad.

In one or more embodiments, the at least one metallization structure (e.g. metal plate, e.g. pad) may include at least one metal or metal alloy.

In one or more embodiments, the at least one separation line region may include or may be a kerf region.

In one or more embodiments, the at least one separation line region may include or may be a scribe line region.

In one or more embodiments, the at least one opening may be located at a center of the at least one metallization structure (e.g. metal plate, e.g. pad).

In one or more embodiments, a position of the at least one opening may correspond to a position of a center of the at least one separation line region, for example to a center of a scribe line.

In one or more embodiments, the wafer may include at least one test structure connected to the at least one metallization structure (e.g. metal plate, e.g. pad), wherein the separation line region intersects the test structure.

In one or more embodiments, the at least one test structure may be configured as a process control monitor (PCM) structure.

In one or more embodiments, the at least one pad may be configured as a process control monitor (PCM) pad.

In one or more embodiments, a dimension of the at least one opening in a transverse direction of the at least one separation line region may be less than a dimension of the at least one separation line region in the transverse direction of the at least one separation line region.

In one or more embodiments, a dimension of the at least one opening in a transverse direction of the at least one separation line region may be equal to or less than about 15 µm.

In one or more embodiments, a dimension of the at least one opening in a transverse direction of the at least one separation line region may be in the range from about 1 µm to about 15 µm.

In one or more embodiments, the at least one metallization structure (e.g. metal plate, e.g. pad) may have a thickness of greater than or equal to about 1 Atm.

In one or more embodiments, the at least one metallization structure (e.g. metal plate, e.g. pad) may have a thickness in the range from about 1 µm to about 3 µm.

In one or more embodiments, the at least one metallization structure (e.g. metal plate, e.g. pad) may include at least one metal from the following group of metals, the group consisting of: aluminum, copper, gold, silver, tin, palladium, zinc, nickel, iron, titanium, or an alloy comprising at least one of the aforementioned metals.

In one or more embodiments, the at least one opening may include or may be at least one hole.

In one or more embodiments, the at least one hole may include or may be at least one through hole.

In one or more embodiments, a depth of the at least one opening may be equal to a thickness of the at least one metallization structure (e.g. metal plate, e.g. pad).

In one or more embodiments, the at least one opening may reach through the at least one metallization structure (e.g. metal plate, e.g. pad), for example through an entire thickness of the at least one metallization structure (e.g. metal plate, e.g. pad).

In one or more embodiments, the at least one opening may reach from a first side (e.g. top side) of the at least one metallization structure (e.g. metal plate, e.g. pad) to a second side (e.g. lower side) of the at least one metallization structure (e.g. metal plate, e.g. pad).

In one or more embodiments, the at least one hole may include or may be at least one blind hole.

In one or more embodiments, a depth of the at least one opening may be less than a thickness of the at least one metallization structure (e.g. metal plate, e.g. pad).

In one or more embodiments, a dimension of the at least one opening in a transverse direction of the at least one separation line region may be less than a dimension of the at least one metallization structure (e.g. metal plate, e.g. pad) in the transverse direction of the at least one separation line region.

In one or more embodiments, a dimension of the at least one opening in a longitudinal direction of the at least one separation line region may be equal to a dimension of the at least one metallization structure (e.g. metal plate, e.g. pad) in the longitudinal direction of the at least one separation line region.

In one or more embodiments, the at least one opening may include or may be at least one slit extending in a longitudinal direction of the at least one separation line region.

In one or more embodiments, a length of the slit may be equal to a dimension of the at least one metallization structure (e.g. metal plate, e.g. pad) in the longitudinal direction of the separation line region.

In one or more embodiments, the at least one slit may include or may be at least one trench.

In one or more embodiments, the at least one separation line region may include at least a first separation line region and a second separation line region along which the wafer is to be diced. The first separation line region may intersect the at least one opening. The second separation line region may intersect the at least one opening.

In one or more embodiments, the first and second separation line regions may intersect one another.

In one or more embodiments, the at least one opening may include at least a first portion extending in a longitudinal direction of the first separation line region, and a second portion extending in a longitudinal direction of the second separation line region.

In one or more embodiments, the first and second portions of the at least one opening may intersect at an intersection of the first and second separation line regions.

In one or more embodiments, the at least one opening may include at least a first opening and at least one additional opening, wherein the separation line region may intersect the first opening and the at least one additional opening.

A wafer in accordance with various embodiments may include: at least one metallization structure; and at least one separation line region along which the wafer is to be diced. The at least one separation line region may intersect at least one part of the at least one metallization structure. The at least one part of the at least one metallization structure intersected by the at least one separation line region may have a smaller thickness than at least one other part of the at least one metallization structure.

In one or more embodiments, the at least one metallization structure may include or may be at least one metal plate.

In one or more embodiments, the at least one metallization structure may include or may be at least one pad.

In one or more embodiments, a thickness of the at least one part of the at least one metallization structure (e.g. metal plate, e.g. pad) intersected by the at least one separation line region may be less than or equal to about 2 µm.

In one or more embodiments, a thickness of the at least one part of the at least one metallization structure (e.g. metal plate, e.g. pad) intersected by the at least one separation line region may be substantially zero.

In one or more embodiments, the at least one metallization structure (e.g. metal plate, e.g. pad) may include or consist of at least one metal or metal alloy.

A method for processing a wafer in accordance with various embodiments may include providing a wafer. The wafer may include at least one metallization structure and at least one separation line region along which the wafer is to be diced. The method may further include forming at least one opening in the at least one metallization structure. The at least one separation line region may intersect the at least one opening.

In one or more embodiments, the at least one metallization structure may include or may be at least one metal plate.

In one or more embodiments, the at least one metallization structure may include or may be at least one pad.

In one or more embodiments, the at least one opening may include or may be at least one hole. In one or more embodiments, the at least one hole may include or may be at least one through hole. In one or more embodiments, the at least one hole may include or may be at least one blind hole. In one or more embodiments, the at least one opening may include or may be at least one slit. In one or more embodiments, the at least one slit may include or may be at least one trench. In one or more embodiments, the at least one opening may include or may be at least one perforation.

In one or more embodiments, the method may further include dicing the wafer along the at least one separation line region after forming the at least one opening in the at least one metallization structure (e.g. metal plate, e.g. pad).

In one or more embodiments, dicing the wafer along the at least one separation line region may include stealth dicing the wafer along the at least one separation line region.

In one or more embodiments, the method may further include electrically contacting the at least one metallization structure (e.g. metal plate, e.g. pad) after forming the at least one opening in the at least one metallization structure (e.g. metal plate, e.g. pad) and before dicing the wafer along the at least one separation line region.

In one or more embodiments, the at least one metallization structure (e.g. metal plate, e.g. pad) may include or may consist of at least one metal or metal alloy.

A method for processing a wafer in accordance with various embodiments may include: providing a wafer, the wafer including at least one metallization structure having at least one opening, and at least one separation line region along which the wafer is to be diced, wherein the at least one separation line region intersects the at least one opening; and dicing the wafer along the at least one separation line region.

In one or more embodiments, the at least one metallization structure may include or may be at least one metal plate. In one or more embodiments, the at least one metallization structure may include or may be at least one pad. In one or more embodiments, the at least one metallization structure (e.g. metal plate, e.g. pad) may include or may consist of at least one metal or metal alloy.

A wafer in accordance with various embodiments may include: at least one metallization structure (e.g. metal plate, e.g. pad) including at least one opening; and at least one separation line region along which the wafer is to be diced, the at least one separation line region intersecting the at least one opening; wherein a dimension of the at least one opening in a longitudinal direction of the at least one separation line region is equal to a dimension of the at least one metallization structure (e.g. metal plate, e.g. pad) in the longitudinal direction of the at least one separation line region. In one or more embodiments, the at least one metallization structure (e.g. metal plate, e.g. pad) may include or consist of at least one metal or metal alloy.

A wafer in accordance with various embodiments may include: at least one metallization structure; and at least one separation line region along which the wafer is to be diced. The at least one separation line region may intersect at least one part of the at least one metallization structure. The at least one part of the at least one metallization structure intersected by the at least one separation line region may have a smaller thickness than at least one other part of the at least one metallization structure.

In one or more embodiments, the at least one metallization structure may include or may be at least one metal plate.

In one or more embodiments, the at least one metallization structure may include or may be at least one pad.

In one or more embodiments, the at least one metallization structure (e.g. metal plate, e.g. pad) may include or consist of at least one metal or metal alloy.

In one or more embodiments, a thickness of the at least one part of the at least one metallization structure (e.g. metal plate, e.g. pad) intersected by the at least one separation line region may be less than or equal to about 2 µm.

In one or more embodiments, a thickness of the at least one part of the at least one metallization structure (e.g. metal plate, e.g. pad) intersected by the at least one separation line region may be substantially zero.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a wafer, comprising:
providing a wafer, the wafer comprising at least one metallization structure, a first separation line region, a second separation line region and third a third separation line region, wherein the wafer is configured to be diced along the first, second, and third separation line regions;
forming at least one opening in the at least one metallization structure, wherein the at least one metallization structure is located within the first separation line region so that first separation line region intersects the at least one opening,
wherein the second and third separation line regions are neighboring parallel separation line regions that are substantially perpendicular to the first separation line region, and wherein the at least one metallization structure is located exclusively between the second and third separation line regions.

2. The method of claim 1, wherein the at least one metallization structure comprises at least one metal plate.

3. The method of claim 1, wherein the at least one metallization structure comprises at least one pad.

4. The method of claim 1,
wherein the at least one opening reaches through the entire thickness of the at least one metallization structure.

5. The method of claim 1, further comprising:
dicing the wafer along the first separation line region after forming the at least one opening in the at least one metallization structure.

6. The method of claim 5,
wherein dicing the wafer along the at least one first separation line region comprises stealth dicing the wafer along the at least one separation line region.

7. The method of claim 5, further comprising:
electrically contacting the at least one metallization structure after forming the at least one opening in the at least one metallization structure and before dicing the wafer along the first separation line region.

8. The method of claim 1, wherein the metallization structure is a PCM structure, and the method further comprises, contacting the PCM structure before dicing the wafer.

9. A method for processing a wafer, comprising:
providing a wafer, the wafer comprising an intermetal dielectric (IMD) and a metallization layer, wherein the IMD layer is disposed over the metallization layer;
removing at least a part of the IMD layer to form an opening in the IMD layer that exposes a portion of a top surface of the metallization layer;
depositing a further metallization layer over the IMD layer and over at least the exposed portion of the top surface of the metallization layer;
patterning the further metallization layer to form a metallization structure within a separation line region; and
dicing the wafer along the separation line region,
wherein patterning the further metallization layer to form the metallization structure comprises forming an opening in the metallization structure, wherein the opening intersects the separation line region.

10. The method of claim 9, wherein removing the IMD layer further comprises etching the IMD layer.

11. The method of claim 9, wherein the further metallization layer is a last metallization layer of the wafer.

12. The method of claim 9, wherein the further metallization layer has a thickness of in range of 1 μm to 3 μm.

13. The method of claim 9, wherein the metallization structure is metal plate or a pad.

14. The method of claim 9, wherein patterning the further metallization layer to form the metallization structure comprises etching the metallization layer using an etch mask.

15. The method of claim 9, wherein the opening in the metallization structure is formed directly over the exposed portion of the top surface of the metallization layer.

16. The method of claim 15, wherein a non-zero distance exists between a bottom of the opening of the metallization structure and the exposed portion of the top surface of the metallization layer.

17. The method of claim 15, wherein the opening in the metallization structure reaches to or below the exposed portion of the top surface of the metallization layer.

18. The method of claim 9, further comprising:
forming a passivation layer over the metallization structure before dicing the wafer; and
removing a portion of the passivation layer to expose a top surface of the metallization structure.

19. The method of claim 9, wherein the opening extends completely through the further metallization layer and extends at least partially through the metallization layer.

20. A method for processing a wafer, comprising:
providing a wafer, the wafer comprising an intermetal dielectric (IMD) and a metallization layer, wherein the IMD layer is disposed over the metallization layer;
removing at least a part of the IMD layer to form an opening in the IMD layer that exposes a portion of a top surface of the metallization layer;
depositing a further metallization layer over the IMD layer and over at least the exposed portion of the top surface of the metallization layer;
patterning the further metallization layer to form a metallization structure; and
dicing the wafer along a separation line region,
wherein patterning the further metallization layer to form the metallization structure comprises forming an opening in the metallization structure, wherein the opening intersects the separation line region,
forming a passivation layer over the metallization structure before dicing the wafer; and
removing a portion of the passivation layer to expose a top surface of the metallization structure, wherein the passivation layer fills the at least one opening of the metallization structure.

* * * * *